United States Patent
Lee et al.

(10) Patent No.: US 9,671,627 B2
(45) Date of Patent: Jun. 6, 2017

(54) TRANSMISSIVE OPTICAL SHUTTER AND METHOD OF MANUFACTURING THE SAME

(71) Applicant: SAMSUNG ELECTRONICS CO., LTD., Suwon-si (KR)

(72) Inventors: Sang-hun Lee, Seoul (KR); Chang-young Park, Yongin-si (KR); Yong-hwa Park, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 483 days.

(21) Appl. No.: 14/298,391

(22) Filed: Jun. 6, 2014

(65) Prior Publication Data

US 2015/0160480 A1 Jun. 11, 2015

(30) Foreign Application Priority Data

Dec. 9, 2013 (KR) .................. 10-2013-0152653

(51) Int. Cl.
*G02F 1/03* (2006.01)
*G02F 1/017* (2006.01)
*H01L 27/146* (2006.01)
*G02F 1/015* (2006.01)
*G02F 1/21* (2006.01)

(52) U.S. Cl.
CPC .......... *G02F 1/017* (2013.01); *G02F 1/01716* (2013.01); *H01L 27/14685* (2013.01); *G02F 2001/0157* (2013.01); *G02F 2001/213* (2013.01); *H01L 27/14625* (2013.01)

(58) Field of Classification Search
CPC ........ G02F 1/00; G02F 1/017; G02F 1/01716; G02F 1/03; G02F 1/07; G02F 2001/0157; G02F 2001/213; H01L 27/00; H01L 27/146; H01L 27/14625; H01L 27/14683; H01L 27/14685; H04N 5/2254; H04N 5/2351; H04N 5/2353; H04N 5/2354
USPC ................ 359/237, 245, 247–250, 252, 259; 250/208.1; 438/68, 460, 478
See application file for complete search history.

(56) References Cited

U.S. PATENT DOCUMENTS

| | | | |
|---|---|---|---|
| 3,270,256 A * | 8/1966 | Mills | B23K 1/00 257/753 |
| 2010/0182671 A1 | 7/2010 | Park | |
| 2013/0077150 A1 | 3/2013 | Lee et al. | |

(Continued)

FOREIGN PATENT DOCUMENTS

| KR | 10-2011-0081649 A | 7/2011 |
|---|---|---|
| KR | 10-2012-013146 A | 12/2012 |
| KR | 10-1236811 B1 | 2/2013 |

(Continued)

*Primary Examiner* — Loha Ben
(74) *Attorney, Agent, or Firm* — Sughrue Mion, PLLC (57) ABSTRACT

Disclosed are a transparent optical shutter which may be manufactured at the wafer level, and a method of manufacturing a transparent optical shutter at the wafer level. In the disclosed optical shutter, a polymer-based material is used as a transparent protective layer for ensuring the mechanical or chemical stability of the optical shutter, and thus, the shutter may be manufactured at the wafer level in large quantities. Also, a layer which is optically transparent and has excellent heat conductivity is disposed under the transparent protective layer.

21 Claims, 6 Drawing Sheets

(56) References Cited

U.S. PATENT DOCUMENTS

2013/0270418 A1 10/2013 Cho et al.
2016/0057404 A1* 2/2016 Lee .................... H04N 13/0207
                                                          348/49

FOREIGN PATENT DOCUMENTS

KR   10-2013-0067819 A   6/2013
KR   10-2013-0073554 A   7/2013

* cited by examiner

TRANSMISSIVE OPTICAL SHUTTER AND METHOD OF MANUFACTURING THE SAME

RELATED APPLICATION

This application claims priority from Korean Patent Application No. 10-2013-0152653, filed on Dec. 9, 2013, in the Korean Intellectual Property Office, the disclosure of which is incorporated herein in its entirety by reference.

BACKGROUND

1. Field

Apparatuses and methods consistent with exemplary embodiments relate to a transmissive optical shutter and a method of manufacturing the same, and more particularly, to a transmissive optical shutter which may be manufactured at the wafer level and a method of manufacturing a transmissive optical shutter at the wafer level.

2. Description of the Related Art

There is a current trend toward increasing the amount of research for developing a three dimensional (3D) camera, a motion sensor, and laser radar (LADAR), among other things, which can acquire information indicating the distance between the apparatus and an object. In particular, with the development of a 3D display device capable of displaying image depth and an increase in demand for the 3D display device, the importance of 3D content is increasing. Accordingly, research is underway for developing various 3D image acquisition apparatuses with which users may create 3D content.

Depth information regarding the distances between surfaces of an object and a 3D image acquisition apparatus may be obtained by using the time-of-flight (TOF) of light. A TOF method involves projecting a laser beam toward an object and then measuring the travel time taken for the light of the laser beam to be reflected by the object and then received by a light-receiving unit. According to the TOF method, light of a particular wavelength (e.g., near infrared (NIR) light of 850 nm) is projected toward an object by using a light-emitting diode (LED) or a laser diode (LD), a light-receiving unit receives light of the same wavelength reflected by the object, and then a special process for extracting distance information is performed. For example, a phase delay may be measured by amplitude-modulating the reflected light with an optical shutter and then generating an image of the modulated reflected light with an imaging device, such as a charge-coupled device (CCD) or a complementary metal-oxide semiconductor (CMOS) sensor. In other words, by accumulating or sampling the amount of light incident on the imaging device over a predetermined period of time, a brightness image may be obtained, and the phase delay and distance may be calculated from the brightness image. This modulation method involves an optical shutter, which can modulate light at a very high speed, that is, at a frequency of about tens of MHz to about hundreds of MHz, to calculate an accurate phase delay.

Recently, a gallium arsenide (GaAs) semiconductor-based optical shutter, which is easily implemented and may operate at low voltage but at very high speed while being small in size, has been suggested. The GaAs-based optical shutter includes a multiple quantum well (MQW) layer disposed between a P-electrode and an N-electrode, and utilizes a phenomenon by which light is absorbed in the MQW layer when a reverse bias is applied to both the P-electrode and the N-electrode. A GaAs-based optical shutter may be classified as a reflective optical shutter or a transmissive optical shutter. In particular, since the configuration of an optical system is simplified by using a transmissive optical shutter, the use of a transmissive optical shutter facilitates the miniaturization of a 3D image acquisition apparatus.

SUMMARY

According to an aspect of an exemplary embodiment, a transmissive optical shutter includes a first contact layer, an epitaxial layer, disposed on a part of the first contact layer, which modulates an intensity of incident light having a particular wavelength, a second contact layer which is disposed on the epitaxial layer, a first electrode which is disposed on the first contact layer, a second electrode which is disposed on the second contact layer, a heat dissipation layer disposed to cover the second electrode and the second contact layer, and a transparent protective layer which is disposed on the heat dissipation layer.

The transmissive optical shutter may further include a substrate disposed under the first contact layer, and an aperture may penetrate a central portion of the substrate so that the first contact layer is exposed.

The transmissive optical shutter may further include an insulating frame which is disposed on the first contact layer and surrounds side surfaces of the epitaxial layer.

A height of an upper surface of the insulating frame off the epitaxial layer may be equal to a height of an upper surface of the second contact layer off the epitaxial layer.

The transmissive optical shutter may further include an electrode pad which is disposed on an upper surface of the insulating frame and electrically connected to the second electrode.

The heat dissipation layer may extend to be in contact with the electrode pad.

The epitaxial layer may include a first reflective layer which is in contact with the first contact layer, a second reflective layer which is in contact with the second contact layer, and an active layer which is interposed between the first reflective layer and the second reflective layer.

The first contact layer and the first reflective layer may be doped to a first conductivity type, and the second contact layer and the second reflective layer may be doped to a second conductivity type which is electrically opposite to the first conductivity type.

The epitaxial layer may be divided into a plurality of cells arranged in a form of a two-dimensional (2D) matrix array.

The transparent protective layer may be transmissive with respect to light having a resonant wavelength of the optical shutter and can be deposited in a semiconductor wafer process.

For example, the transparent protective layer may be formed of a material including parylene or epoxy resin.

The heat dissipation layer may be formed of a material which is transmissive with respect to light having a resonant wavelength of the optical shutter and heat conductive.

For example, the heat dissipation layer may be formed of a material including aluminum nitride (AlN) or alumina ($Al_2O_3$).

According to an aspect of another exemplary embodiment, a three-dimensional (3D) image acquisition apparatus includes a light source which projects light toward an object, an optical shutter which modulates reflected light reflected by the object, and an imaging device which generates a depth image by imaging light modulated by the optical shutter. The optical shutter includes a first contact layer, an epitaxial layer which is disposed on a part of the first contact layer and modulates an intensity of incident light having a particular wavelength, a second contact layer which is disposed on the epitaxial layer, a first electrode which is disposed on the first contact layer, a second electrode which is disposed on the second contact layer, a heat dissipation layer disposed to cover the second electrode and the second contact layer, and a transparent protective layer which is disposed on the heat dissipation layer.

According to an aspect of another exemplary embodiment, a method of manufacturing an optical shutter includes sequentially depositing a first contact layer, an epitaxial layer, and a second contact layer on a substrate, mesa-etching the epitaxial layer and the second contact layer so that a part of the first contact layer is exposed, forming a first electrode on the exposed part of the first contact layer, forming a second electrode on the second contact layer, forming a heat dissipation layer to cover the second contact layer and the second electrode, forming a transparent protective layer on the heat dissipation layer, and forming an aperture by removing a central portion of the substrate to expose the first contact layer.

The method may further include, after the forming of the first electrode and before the forming of the second electrode, forming an insulating frame to cover the first contact layer and the first electrode and surround side surfaces of the epitaxial layer.

The method may further include forming an electrode pad electrically connected to the second electrode on an upper surface of the insulating frame, and the electrode pad and the second electrodes may be simultaneously formed.

The method may further include performing dicing after the forming of the aperture, and the sequentially depositing of the first contact layer, the epitaxial layer, and the second contact layer on the substrate through the forming of the aperture all may be performed in a semiconductor wafer process.

BRIEF DESCRIPTION OF THE DRAWINGS

These and/or other exemplary aspects and advantages will become apparent and more readily appreciated from the following description of exemplary embodiments, taken in conjunction with the accompanying drawings in which.

DETAILED DESCRIPTION

Reference will now be made in detail to exemplary embodiments which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. The term "on" used in the following description of a layer structure may denote an element which is not in contact with another element but is above the other element as well as an element which is in contact with another element, that is, directly on the other element. Expressions such as "at least one of," when preceding a list of elements, modify the entire list of elements and do not modify the individual elements of the list.

Figure 1:
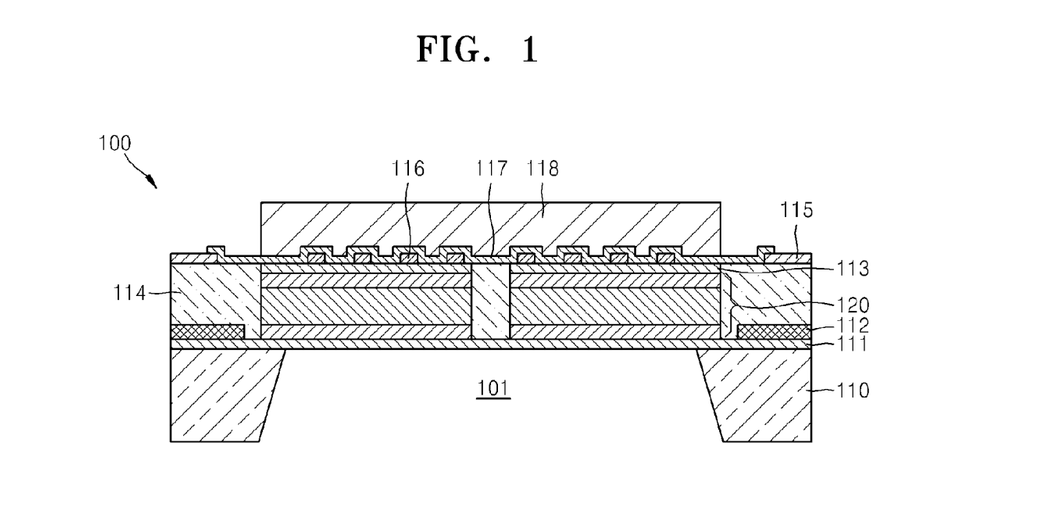
FIG. 1 is a cross-sectional view schematically showing a structure of an optical shutter according to an exemplary embodiment.

FIG. 1 is a cross-sectional view schematically showing a structure of an optical shutter according to an exemplary embodiment. Referring to FIG. 1, an optical shutter 100 may include a substrate 110, a first contact layer 111 disposed on the substrate 110, an epitaxial layer 120 disposed on a portion of the first contact layer 111, a second contact layer 113 disposed on the epitaxial layer 120, a first electrode 112 disposed on the first contact layer 111, and a second electrode 116 disposed on the second contact layer 113. Also, the optical shutter 100 may further include an insulating frame 114 disposed on the first contact layer 111 to surround side surfaces of the epitaxial layer 120, a heat dissipation layer 117 disposed to cover the second electrode 116 and the second contact layer 113, an electrode pad 115 disposed on the insulating frame 114, and a transparent protective layer 118 disposed on the heat dissipation layer 117.

The substrate 110 may be formed of, for example, silicon (Si), gallium arsenide (GaAs), silicon carbide (SiC), or the like. The optical shutter 100 according to the present embodiment is a transmissive type optical shutter, and an aperture 101 may be formed at the center of the substrate 110 so that light may be transmitted through the optical shutter 100. The aperture 101 may be formed to penetrate through a central portion of the substrate 110 so that the first contact layer 111 is exposed.

The epitaxial layer 120 serves to modulate the intensity of incident light having a particular wavelength by using the electroabsorption effect. To this end, the epitaxial layer 120 may have a Fabry-Perot resonator structure, as shown in FIG. 2, in which an active layer 122 is disposed between first and second reflective layers 121 and 123.

For example, the active layer 122 may have a multiple quantum well (MQW) structure including a plurality of barrier layers 122b formed of aluminum gallium arsenide (AlGaAs) and a plurality of quantum well layers 122a formed of GaAs. Also, the active layer 122 may serve as a main cavity for Fabry-Perot resonance. To this end, the active layer 122 may have an optical thickness (i.e., a value obtained by multiplying a physical thickness and the refractive index of a layer) of about an integer multiple of $\lambda/2$ (where $\lambda$ is the wavelength of the incident light to be modulated or a resonant wavelength). For example, $\lambda$ in the optical shutter 100 according to the present embodiment may be a wavelength of about 850 nm, in the infrared region.

The first and second reflective layers 121 and 123 may be, for example, distributed Bragg reflectors (DBRs) respectively having a structure in which a low refractive index layer 121a having a relatively low refractive index and a high refractive index layer 121b having a relatively high refractive index are alternately and repeatedly stacked and a structure in which a low refractive index layer 123a having a relatively low refractive index and a high refractive index layer 123b having a relatively high refractive index are alternately and repeatedly stacked. An optical thickness of each of the low refractive index layers 121a and 123a and the high refractive index layers 121b and 123b may be about an odd number multiple of λ/4. A reflectance of the first reflective layer 121 and a reflectance of the second reflective layer 123 may be approximately the same as each other. Also, the first and second reflective layers 121 and 123 may serve as current paths for providing current to the active layer 122. To this end, the first and second reflective layers 121 and 123 may be doped to be electrically opposite to each other. For example, the first reflective layer 121 may be an n-DBR layer doped to n-type, and the second reflective layer 123 may be a p-DBR layer doped to p-type. Alternatively, the first reflective layer 121 may be a p-DBR layer, and the second reflective layer 123 may an n-DBR layer.

Figure 2:
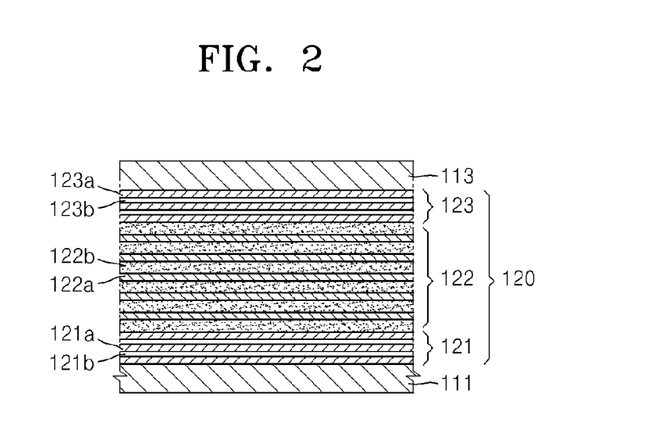
FIG. 2 is a cross-sectional view showing in detail an exemplary structure of an epitaxial layer of the optical shutter shown in FIG. 1.

To aid in understanding, FIG. 2 shows the epitaxial layer 120 having the simplest structure as an example. However, to improve the bandwidth and the demodulation contrast of the optical shutter 100, the epitaxial layer 120 may be modified variously based on the structure shown in FIG. 2. For example, an additional cavity may be further included in at least one of the first and second reflective layers 121 and 123, the plurality of quantum well layers 122a having different optical thicknesses may be disposed in the active layer 122, or three or more reflective layers and two or more active layers may be alternately disposed. The optical shutter 100 according to the present embodiment may include the epitaxial layer 120 having any structure which may modulate light of a particular wavelength by using the electroabsorption effect.

Meanwhile, to prevent parasitic capacitance, the epitaxial layer 120 may, instead of consisting of one large-area cell, be divided into a plurality of small cells. For example, the cross-sectional view of FIG. 1 shows that the epitaxial layer 120 consists of two separated cells. However, this is merely an example, and the optical shutter 100 according to the present embodiment is not limited thereto. For example, the epitaxial layer 120 may be divided into a plurality of cells which are arranged in the form of any of various a n×m two dimensional (2D) matrix arrays (where n and m are natural numbers greater than 1).

On the lower and upper surfaces of the epitaxial layer 120, the first and second contact layers 111 and 113 may be disposed, respectively. The first and second contact layers 111 and 113 serve to electrically connect the epitaxial layer 120 to the electrodes 112 and 116. For example, the first contact layer 111 may be disposed on the substrate 110, and the epitaxial layer 120 may be partially disposed on the first contact layer 111. In particular, the first reflective layer 121 of the epitaxial layer 120 may be in contact with the first contact layer 111. The second contact layer 113 is disposed on the epitaxial layer 120, and in particular, the second reflective layer 123 of the epitaxial layer 120 may be in contact with the second contact layer 113. When the epitaxial layer 120 is divided into two or more cells, the second contact layer 113 may be disposed in each cell.

As will be described later, the first contact layer 111 may also serve as an etch-stop layer when the substrate 110 is etched to form the aperture 101. Therefore, the first contact layer 111 may be formed of a material which serves as an electrical contact, is transmissive with respect to light having the resonant wavelength, and is not etched by an etchant for etching the substrate 110. For example, the first contact layer 111 may be formed of a semiconductor material including indium gallium phosphide (InGaP). Also, the second contact layer 113 may be formed of a material which serves as an electrical contact and is transmissive with respect to light having the resonant wavelength. For example, the second contact layer 113 may be formed of a semiconductor material including InGaP or GaAs.

The first contact layer 111 may be doped to the same conductivity type as the first reflective layer 121, and the second contact layer 113 may be doped to the same conductivity type as the second reflective layer 123. For example, when the first reflective layer 121 is doped to n-type and the second reflective layer 123 is doped to p-type, the first contact layer 111 may be formed of n-InGaP, and the second contact layer 113 may be formed of p-InGaP or p-GaAs. Also, when the first reflective layer 121 is doped to p-type and the second reflective layer 123 is doped to n-type, the first contact layer 111 may be formed of p-InGaP, and the second contact layer 113 may be formed of n-InGaP or n-GaAs.

The epitaxial layer 120 is disposed on only a part of the upper surface of the first contact layer 111, and the first electrode 112 may be disposed on the remaining part of the upper surface of the first contact layer 111. Also, the second electrode 116 may be disposed on the upper surface of the second contact layer 113. The first electrode 112 and the second electrode 116 may be formed of a metal or a metal oxide having electrical conductivity. To reduce blocking of light as much as possible and improve current injection efficiency, the second electrode 116 may be formed as, for example, a fish bone-, matrix-, or mesh-shaped grating. Alternatively, the second electrode 116 may be formed of, for example, a metal oxide which is transparent to light, such as indium tin oxide (ITO).

Since the total thickness of the epitaxial layer 120 is only about 5 μm, the epitaxial layer 120 may be mechanically or chemically vulnerable. Therefore, the optical shutter 100 may further include the insulating frame 114 and the transparent protective layer 118 to protect the epitaxial layer 120. The insulating frame 114 may be formed to cover the first contact layer 111 and the first electrode 112 and surround the side surfaces of the epitaxial layer 120. The insulating frame 114 may be formed of an insulating material with low permittivity to reduce parasitic capacitance as much as possible. For example, the insulating frame 114 may be formed of a material, such as benzocyclobutene (BCB) or polyimide. On the upper surface of the insulating frame 114, the electrode pad 115, for connecting an external power to the second electrode 116, may be further disposed. Although not shown in the cross-sectional view of FIG. 1, the electrode pad 115 may be electrically connected to the second electrode 116 through a metal wiring or the like.

Figure 3:
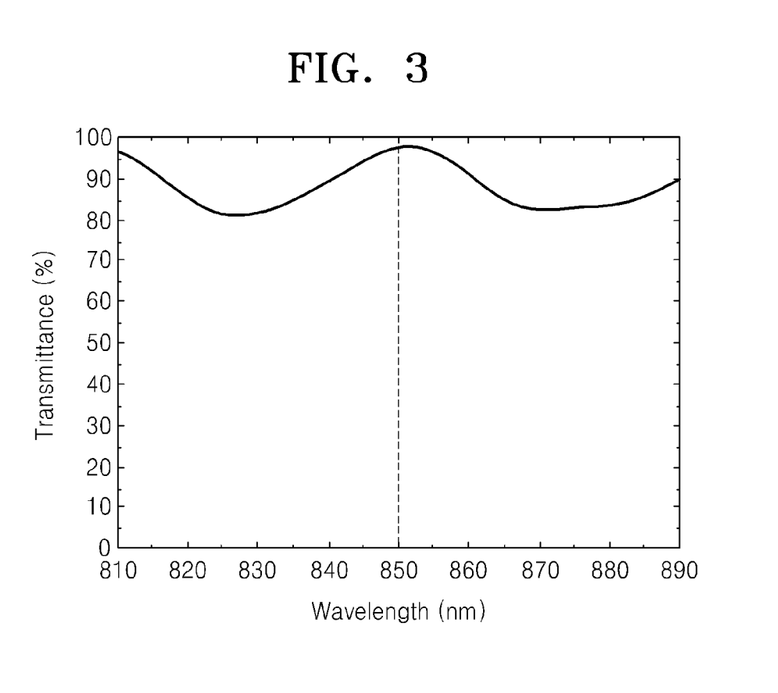
FIG. 3 is a graph showing a transmittance characteristic of a transparent protective layer of the optical shutter shown in FIG. 1.

The transparent protective layer 118 may be disposed to cover the upper side of the epitaxial layer 120. Even when the epitaxial layer 120 is divided into a plurality of cells, the one transparent protective layer 118 may be formed to cover the entire area of the epitaxial layer 120. The transparent protective layer 118 may be formed of a material which may be deposited by using a method, such as chemical vapor deposition (CVD), in the semiconductor wafer process, is highly transmissive with respect to light (e.g., in the infrared region) having a particular wavelength (i.e., the resonant wavelength of the optical shutter 100), and is thermally or chemically stable. For example, the transparent protective layer 118 may be formed of parylene, epoxy resin such as SU-8, or the like. FIG. 3 is a graph showing a transmittance characteristic of the transparent protective layer 118 formed of parylene having a thickness of about 5 μm. Referring to the graph of FIG. 3, it is shown that the transparent protective layer 118 has a high transmittance of about 98.5% for light having a wavelength of about 850 nm.

Figure 4:
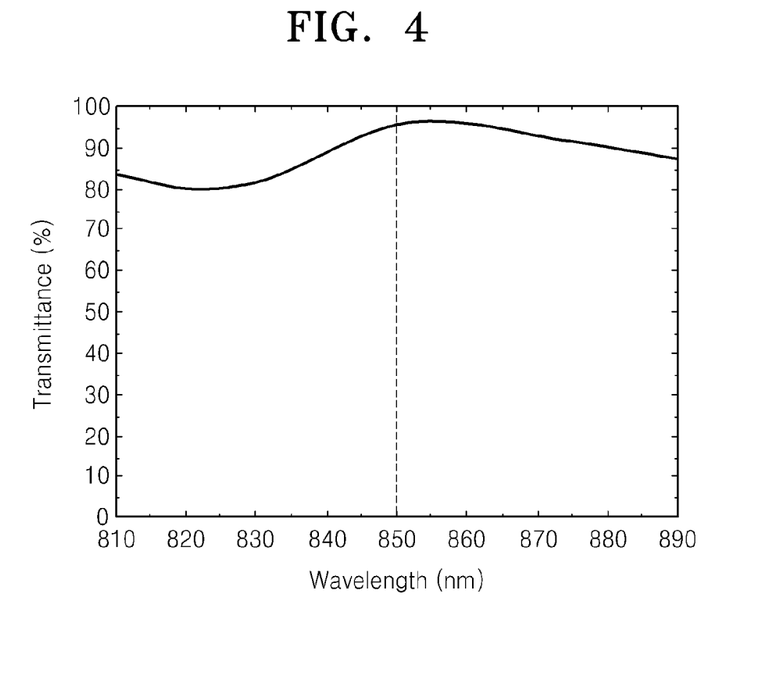
FIG. 4 is a graph showing a transmittance characteristic of a heat dissipation layer of the optical shutter shown in FIG. 1.

When the transparent protective layer 118 is formed of a polymer-based material as mentioned above, it may be difficult to dissipate heat generated from the epitaxial layer 120 to the outside of the optical shutter 100. Therefore, the heat dissipation layer 117 formed of an insulating material which is highly transmissive with respect to light (e.g., in the infrared region) having the particular wavelength (i.e., the resonant wavelength of the optical shutter 100) and high heat conductivity may be additionally disposed between the transparent protective layer 118 and the epitaxial layer 120. For example, the heat dissipation layer 117 may be formed on the epitaxial layer 120 to cover the second contact layer 113 and the second electrode 116. To increase the heat dissipation effect, the heat dissipation layer 117 may extend to the electrode pad 115 formed of a metal. Thereby, the heat generated from the epitaxial layer 120 may be transferred to the electrode pad 115 via the heat dissipation layer 117, and then dissipated to the outside of the optical shutter 100. The heat dissipation layer 117 may be formed of, for example, aluminum nitride (AlN), alumina ($Al_2O_3$), or the like. FIG. 4 is a graph showing a transmittance characteristic of the heat dissipation layer 117 formed of AlN having a thickness of about 2.1 μm. Referring to the graph of FIG. 4, it is possible to see that the heat dissipation layer 117 has a high transmittance of about 97% for light having the wavelength of about 850 nm.

FIGS. 5A to 5I are cross-sectional views schematically showing a process of manufacturing the optical shutter 100 according to the present embodiment.

Figure 5A:
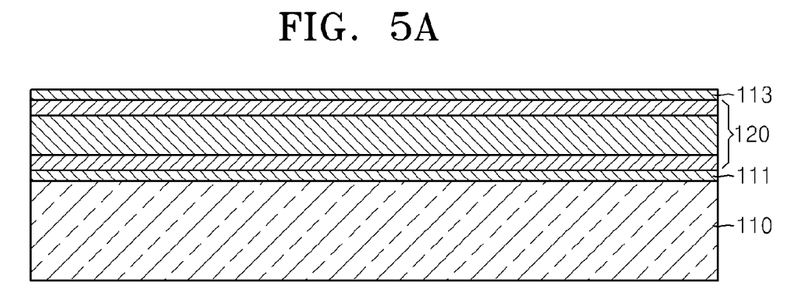
FIGS. 5A to 5I are cross-sectional views schematically showing a process of manufacturing the optical shutter shown in FIG. 1.

First, referring to FIG. 5A, the first contact layer 111 is formed on the upper surface of the substrate 110 formed of, for example, GaAs. As described above, the first contact layer 111 may be formed of n-InGaP or p-InGaP. Then, the epitaxial layer 120 is grown on the first contact layer 111. According to an epitaxial growth method, the epitaxial layer 120 may be formed by the sequential formation of the first reflective layer 121, the active layer 122, and the second reflective layer 123. As described above, the epitaxial layer 120 may be formed to have various structures as well as the structure shown in FIG. 2. Subsequently, the second contact layer 113 may be formed on the epitaxial layer 120. For example, the second contact layer 113 may be formed of at least one of p-InGaP and p-GaAs or at least one of n-InGaP and n-GaAs.

Figure 5B:
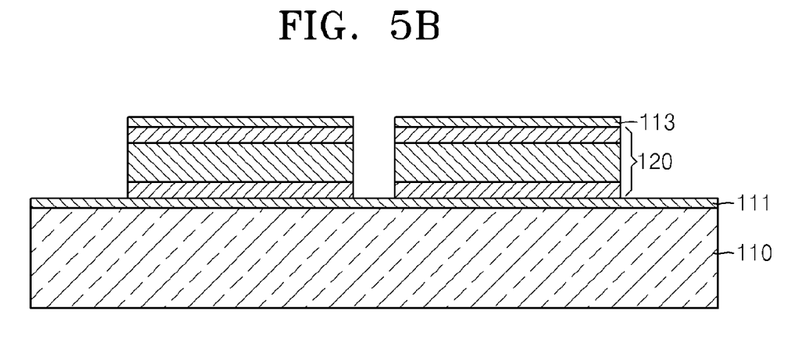

Next, referring to FIG. 5b, the epitaxial layer 120 and the second contact layer 113 may be partially etched by mesa etching so that a part of the first contact layer 111 is exposed. As a result of this process, the epitaxial layer 120 may be divided into a plurality of cells. FIG. 5B shows the epitaxial layer 120 divided into two cells as an example, but the division of the epitaxial layer 120 is not limited to this example. Alternatively, the epitaxial layer 120 may not be divided into a plurality of cells, and only the edge of the epitaxial layer 120 may be etched so that a part of the first contact layer 111 is exposed.

Figure 5C:
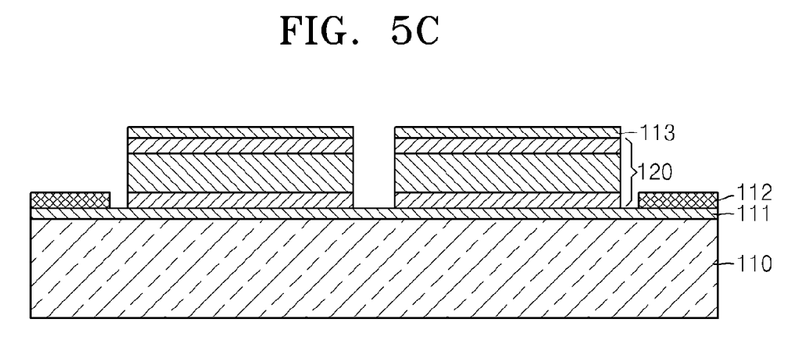
Figure 5D:
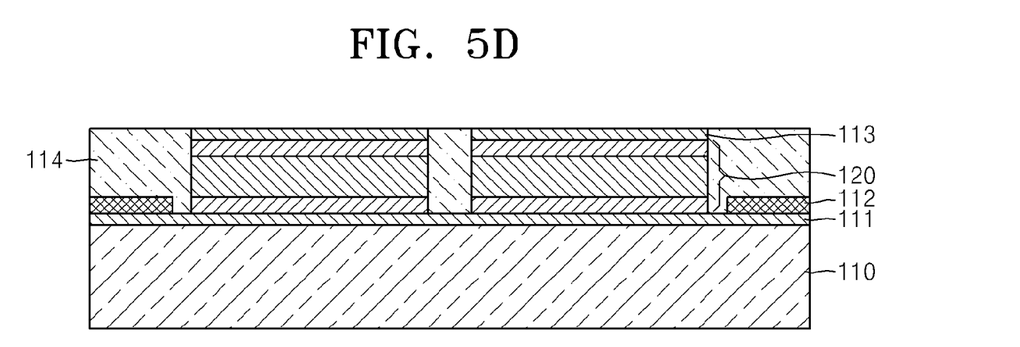

Subsequently, referring to FIGS. 5C and 5D, the first electrode 112 is formed on the upper surface of the exposed first contact layer 111, and then the insulating frame 114 may be formed to cover the first electrode 112 and the first contact layer 111 and surround side surfaces of the epitaxial layer 120. Here, the upper surface of the insulating frame 114 may be formed to have the same height as the upper surface of the second contact layer 113 so that there is almost no step difference between the upper surface of the insulating frame 114 and the upper surface of the second contact layer 113. In other words, the upper surface of the insulating frame 114 and the upper surface of the second contact layer 113 may be present on the same plane. The gap between cells of the plurality of divided cells of the epitaxial layer 120 may be filled by the insulating frame 114.

Figure 5E:
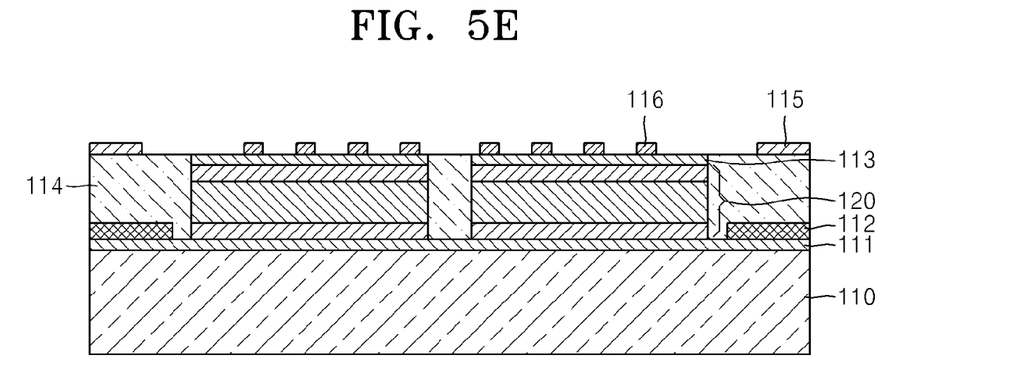

Then, referring to FIG. 5E, the second electrode 116 may be formed on the second contact layer 113, and the electrode pad 115 may be formed on the insulating frame 114. The second electrode 116 and the electrode pad 115 may be formed of the same material at the same time. For example, by forming one conductive material layer on the upper surface of the second contact layer 113 and the upper surface of the insulating frame 114 and then patterning the conductive material layer, the second electrode 116 and the electrode pad 115 may be formed.

Figure 5F:
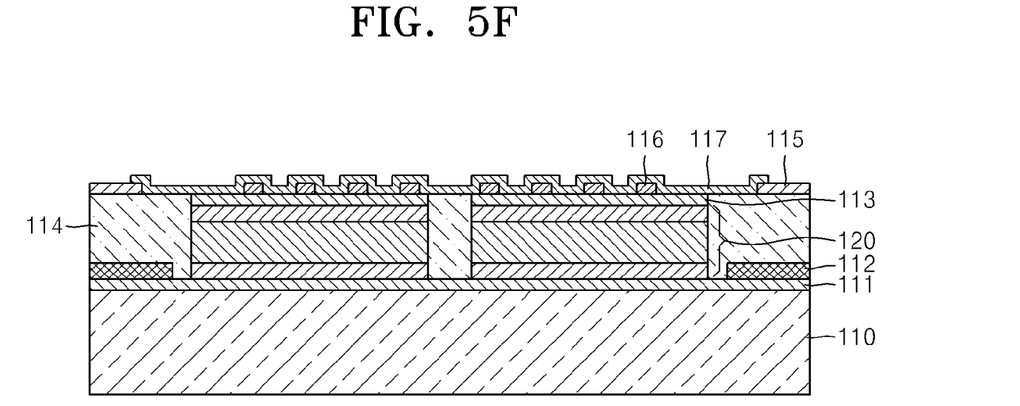

Subsequently, referring to FIG. 5F, the heat dissipation layer 117 may be formed to cover the second contact layer 113 and the second electrode 116. As described above, the heat dissipation layer 117 may be formed of, for example, AlN, $Al_2O_3$, or the like. The heat dissipation layer 117 may be formed to have a uniform thickness on all the surfaces of the second electrode 116, the electrode pad 115, the second contact layer 113, and the insulating frame 114, and then, a part of the heat dissipation layer 117 formed on the electrode pad 115 may be removed. Then, the heat dissipation layer 117 which covers the second electrode 116 and extends to be in contact with a part of the upper surface of the electrode pad 115 may be formed.

Figure 5G:
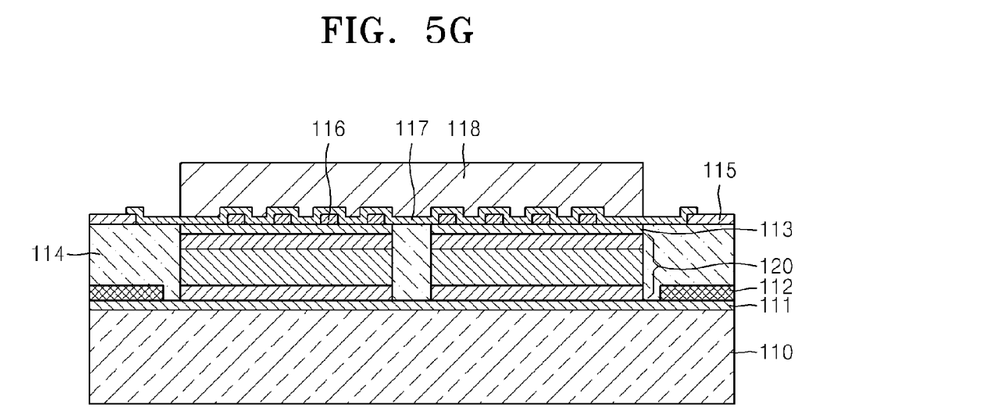

Subsequently, referring to FIG. 5G, the transparent protective layer 118 is formed to cover the epitaxial layer 120. For example, the transparent protective layer 118 may be formed of SU-8 or parylene by using CVD. As shown in FIG. 5G, the transparent protective layer 118 may be only formed in an area corresponding to the epitaxial layer 120. Therefore, a part of the heat dissipation layer 117 and the electrode pad 115 may be exposed without being covered by the transparent protective layer 118.

Figure 5H:
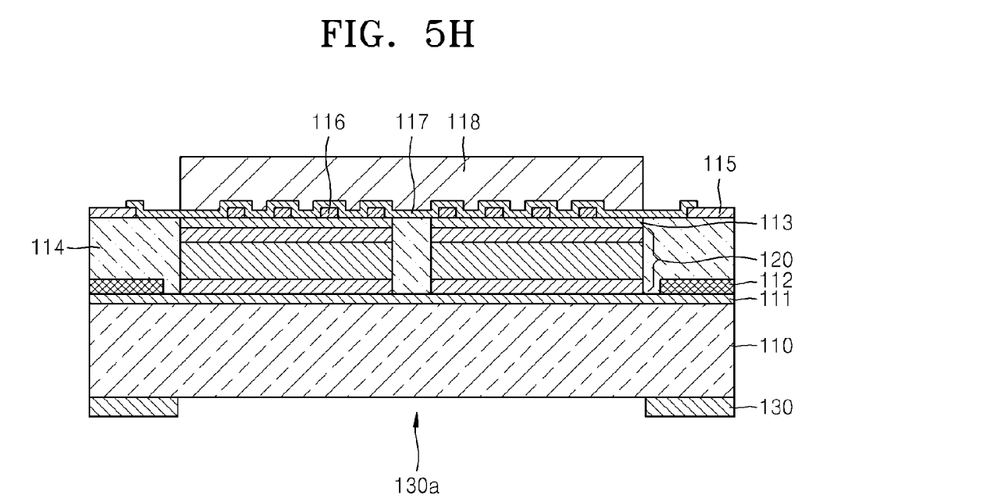

Next, referring to FIG. 5H, a mask layer 130 is formed on the lower surface of the substrate 110 and patterned. For example, the mask layer 130 may be left on the edge of the lower surface of the substrate 110 and removed from a central portion of the lower surface of the substrate 110, thus forming an aperture 130a at the central portion of the mask layer 130.

Figure 5I:
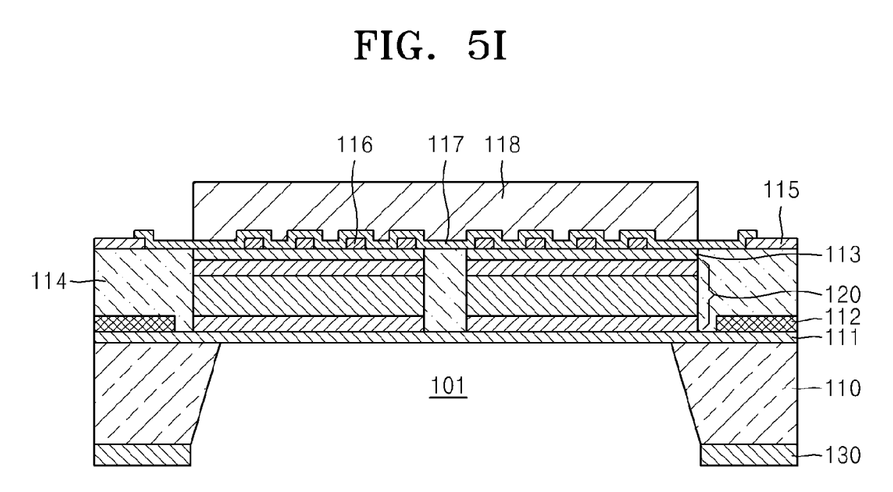

Lastly, referring to FIG. 5I, when the substrate 110 is formed of, for example, GaAs, the central portion of the substrate 110 may be removed by wet etching using an etchant, such as hydroxide solution ($NH_4OH$). The first contact layer 111, formed of InGaP, serves as an etch-stop layer. Therefore, when the central portion of the substrate 110 is completely removed and the first contact layer 111 formed of InGaP is exposed, etching may be stopped, and the aperture 101 may be thus formed at the center of the substrate 110. Therefore, light incident on the transparent protective layer 118 may be emitted to the outside of the optical shutter 100 via the epitaxial layer 120, the first contact layer 111, and the aperture 101.

FIGS. 5H and 5I illustrate an example of forming the aperture 101 through which light may pass in the substrate 110 by using the mask layer 130. However, when the substrate 110 is formed of a material having a high transmittance with respect to light in the infrared region, the process of forming the aperture 101 may be omitted. Also, according to an exemplary embodiment, the process of FIG. 5H may be omitted, and the whole substrate 110 may be etched and removed in the process of FIG. 5I.

Since the transparent protective layer 118 for ensuring the mechanical or chemical stability of the optical shutter 100 may be deposited by using a method, such as CVD, in the semiconductor wafer process, the optical shutter 100 according to the above-described embodiment may be manufactured in large quantities at a wafer level. In other words, the entire manufacturing process illustrated in FIGS. 5A to 5I may be performed at a wafer level. After the process of FIG. 5I is completed, a plurality of optical shutters 100 formed on one wafer may be diced.

Alternately, when a material which is not processed in the semiconductor wafer process, such as glass or sapphire, is used as the transparent protective layer 118, dicing is performed after the process of FIG. 5E is completed. After that, one transparent protective layer 118 is attached to each of the separate chips, each of the chips is mounted on an etching jig, and then an etching process of the substrate 110 illustrated in FIGS. 5H and 5I is performed. Therefore, when a material which is not processed in the semiconductor wafer process, such as glass or sapphire, is used as the transparent protective layer 118, the manufacturing process is more complex.

In addition, according to the present embodiment, the heat dissipation layer 117 which is optically transparent and has excellent heat conductivity is disposed under the transparent protective layer 118, and thus heat generated from the optical shutter 100 may be effectively dispersed. Therefore, even when a polymer-based material having almost no heat conductivity is used as the transparent protective layer 118, the optical shutter 100 may dissipate heat.

Figure 6:
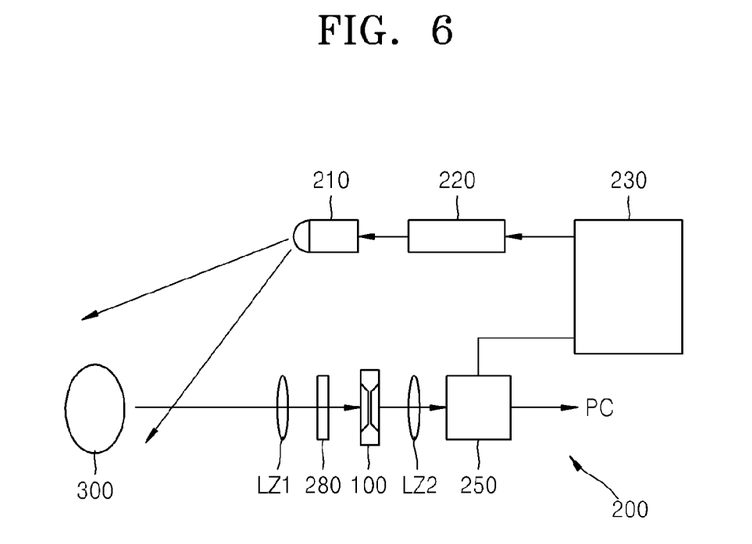
FIG. 6 is a conceptual diagram schematically showing a configuration of a three dimensional (3D) image acquisition apparatus including the optical shutter shown in FIG. 1.

FIG. 6 is a conceptual diagram schematically showing a configuration of a three dimensional (3D) image acquisition apparatus 200 including the optical shutter 100 shown in FIG. 1 according to an exemplary embodiment. Referring to FIG. 6, the 3D image acquisition apparatus 200 according to the present embodiment may include a light source 210, a light source driver 220, a controller 230, an imaging device 250, first and second lenses LZ1 and LZ2, a band-pass filter 280, and the optical shutter 100 having the above-described structure. Here, a first lens LZ1, a band-pass filter 280, the optical shutter 100, a second lens LZ2, and an imaging device 250 may be arranged in one line along a common optical axis.

The optical source 210 may emit illumination light toward an object 300 according to control of the light source driver 220. As the light source 210, a light-emitting diode (LED) or a laser diode (LD) which emits illumination light having a near-infrared (NIR) wavelength of about 850 nm, invisible to human eyes so as to protect human eyes, may be used. However, this is merely an example, and illumination light of another wavelength band and a light source of another type may be used according to a design. Also, the light source 101 may project illumination light having a particularly defined waveform, for example, a pulse wave, a sine wave, a ramp wave, a square wave, etc., toward the object 300, according to a control signal received from the light source driver 220. Operation of the light source diver 220 may be controlled by the controller 230.

The controller 230 may also control operation of the optical shutter 100 and the imaging device 250. To obtain depth information on the object 300, the optical shutter 100 serves to modulate reflected light reflected by the object 300 with a predetermined gain waveform according to control of the controller 230. A period of the gain waveform of the optical shutter 100 may be the same as a period of the illumination light generated by the light source 210. The gain waveform of the optical shutter 100 may also be a particularly defined waveform, for example, a pulse wave, a sine wave, a ramp wave, a square wave, etc., according to a control signal received from the controller 230.

The first lens LZ1 is an objective lens which collects the reflected light RL from the object 300 so that the reflected light may be appropriate to be incident on the band-pass filter 280. The band-pass filter 280 may serve to remove ambient light component from the reflected light, while not removing the illumination light. For example, the band-pass filter 280 may transmit only light having a wavelength of about 850 nm in the infrared region. The second lens LZ2 serves to direct the reflected light modulated by the optical shutter 100 onto the imaging device 250. The imaging device 250 may be a semiconductor imaging device, for example, a charge-coupled device (CCD) or a complementary metal-oxide semiconductor (CMOS) sensor. A depth image obtained by the imaging device 250 may be sent to a personal computer (PC), and the PC may extract distance information between the 3D image acquisition device 200 and the object 300 by using the depth image according to a previously input algorithm.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more embodiments of the present disclosure have been described with reference to the figures, it will be understood by those of ordinary skill in the art that various changes in form and details may be made therein without departing from the spirit and scope of the present disclosure as defined by the following claims.

What is claimed is:

1. An optical shutter comprising:
   a first contact layer;
   an epitaxial layer disposed on a part of the first contact layer, wherein the epitaxial layer modulates an intensity of incident light having a particular wavelength;
   a second contact layer disposed on the epitaxial layer;
   a first electrode disposed on the first contact layer;
   a second electrode disposed on the second contact layer;
   a heat dissipation layer covering the second electrode and the second contact layer; and
   a transparent protective layer disposed on the heat dissipation layer.

2. The optical shutter of claim 1, further comprising:
   a substrate,
   wherein the first contact layer is disposed on the substrate, and
   wherein an aperture penetrates a central portion of the substrate so that the first contact layer is exposed within the aperture.

3. The optical shutter of claim 1, further comprising an insulating frame which is disposed on the first contact layer and which surrounds side surfaces of the epitaxial layer.

4. The optical shutter of claim 3, wherein a distance between of an upper surface of the insulating frame and an upper surface of the first contact layer is equal to a distance between an upper surface of the second contact layer and an upper surface of the first contact layer.

5. The optical shutter of claim 3, further comprising an electrode pad disposed on an upper surface of the insulating frame and electrically connected to the second electrode.

6. The optical shutter of claim 5, wherein the heat dissipation layer is also disposed on the electrode pad.

7. The optical shutter of claim 1, wherein the epitaxial layer comprises:
   a first reflective layer in contact with the first contact layer;

a second reflective layer in contact with the second contact layer; and an active layer disposed between the first reflective layer and the second reflective layer.

8. The optical shutter of claim 7, wherein:

the first contact layer and the first reflective layer are doped to a first conductivity type, and the second contact layer and the second reflective layer are doped to a second conductivity type which is electrically opposite to the first conductivity type.

9. The optical shutter of claim 1, wherein the epitaxial layer is divided into a plurality of cells arranged in a two-dimensional (2D) matrix array.

10. The optical shutter of claim 1, wherein the transparent protective layer is formed of a material which is transmissive with respect to light having a resonant wavelength of the optical shutter and can be deposited in a semiconductor wafer process.

11. The optical shutter of claim 10, wherein the transparent protective layer is formed of at least one of parylene and epoxy resin.

12. The optical shutter of claim 1, wherein the heat dissipation layer is formed of a material which is transmissive with respect to light having a resonant wavelength of the optical shutter and is thermally conductive.

13. The optical shutter of claim 12, wherein the heat dissipation layer is formed of a material comprising at least one of aluminum nitride (AlN) and alumina ($Al_2O_3$).

14. A three-dimensional (3D) image acquisition apparatus comprising:

a light source;

an optical shutter which modulates light from the light source that is reflected by an object; and an imaging device which generates a depth image using the light modulated by the optical shutter, wherein the optical shutter comprises:

a first contact layer;

an epitaxial layer disposed on a part of the first contact layer, wherein the epitaxial layer modulates an intensity of the light from the light source having a particular wavelength;

a second contact layer disposed on the epitaxial layer;

a first electrode disposed on the first contact layer;

a second electrode disposed on the second contact layer;

a heat dissipation layer covering the second electrode and the second contact layer; and a transparent protective layer disposed on the heat dissipation layer.

15. A method of manufacturing an optical shutter, the method comprising:

depositing a first contact layer on a substrate;

depositing an epitaxial layer on the first contact layer;

depositing a second contact layer on the epitaxial layer;

mesa-etching the epitaxial layer and the second contact layer so that a part of the first contact layer is exposed;

forming a first electrode on an exposed part of the first contact layer;

forming a second electrode on the second contact layer;

forming a heat dissipation layer covering the second contact layer and the second electrode;

forming a transparent protective layer on the heat dissipation layer; and forming an aperture by removing a central portion of the substrate, thereby exposing the first contact layer.

16. The method of claim 15, further comprising, after the forming the first electrode and before the forming the second electrode, forming an insulating frame covering the first contact layer and the first electrode and surrounding side surfaces of the epitaxial layer.

17. The method of claim 16, further comprising forming an electrode pad, electrically connected to the second electrode, on an upper surface of the insulating frame, wherein forming the electrode pad and the forming the second electrode are performed simultaneously.

18. The method of claim 15, wherein the transparent protective layer is formed of a material comprising at least one of parylene and epoxy resin.

19. The method of claim 15, wherein the heat dissipation layer is formed of at least one of aluminum nitride (AlN) and alumina ($Al_2O_3$).

20. The method of claim 15, further comprising dicing the substrate and all layers disposed thereon, wherein the depositing the first contact layer, depositing the epitaxial layer, the depositing the second contact layer, the mesa etching, the firming the first electrode, the forming the second electrode, the forming the heat dissipation layer, the forming the transparent protective layer, and the forming the aperture all are performed in a semiconductor wafer process.

21. A method of manufacturing a plurality of optical shutters, the method comprising:

depositing a first contact layer on a substrate;

depositing an epitaxial layer on the first contact layer;

depositing a second contact layer on the epitaxial layer;

mesa-etching the epitaxial layer and the second contact layer so that a part of the first contact layer is exposed and forming a plurality of mesas, each comprising the epitaxial layer and the second contact layer disposed on the first contact layer;

forming a plurality of first electrodes on an exposed part of the first contact layer;

forming an insulation frame covering first contact layer and surrounding side surfaces of the plurality of mesas;

forming a plurality of second electrodes on the second contact layer of each of the plurality of mesas;

forming a heat dissipation layer covering the second contact layer and the plurality of second electrodes;

forming a plurality of apertures by removing a central portion of the substrate below each of the plurality of mesas, thereby exposing the first contact layer under each of the plurality of mesas; and dicing the substrate and all layers disposed on the substrate into a plurality of optical shutters.

* * * * *